(12) United States Patent
Shimamoto

(10) Patent No.: US 12,489,406 B2
(45) Date of Patent: Dec. 2, 2025

(54) POWER AMPLIFIER CIRCUIT

(71) Applicant: Murata Manufacturing Co., Ltd., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 516 days.

(21) Appl. No.: 18/052,629

(22) Filed: Nov. 4, 2022

(65) Prior Publication Data

US 2023/0141220 A1    May 11, 2023

(30) Foreign Application Priority Data

Nov. 5, 2021   (JP) .................. 2021-181162

(51) Int. Cl.
*H03F 1/32*   (2006.01)
*H03F 3/24*   (2006.01)

(52) U.S. Cl.
CPC ............... *H03F 1/32* (2013.01); *H03F 3/245* (2013.01); *H03F 2200/451* (2013.01)

(58) Field of Classification Search
CPC ....... H03F 1/32; H03F 3/245; H03F 2200/451
USPC ........................................................ 330/296
See application file for complete search history.

(56) References Cited

U.S. PATENT DOCUMENTS 7,248,111 B1 *   7/2007   Xu ................. H03G 3/3047
                                                      330/296
2018/0342992 A1 *   11/2018   Sato ................. H03F 3/213

FOREIGN PATENT DOCUMENTS

| CN | 108055011 B | * | 8/2024 | ............... H03F 1/56 |
| JP | 2009-165100 A | | 7/2009 | |
| JP | 2009165100 A5 | * | 7/2009 | ............... H03F 1/32 |

OTHER PUBLICATIONS

Chang et al., "Device Characteristics Analysis of GaAs/InGaP HBT Power Cells Using Conventional Through Wafer via Process and Copper Pillar Bump Process", published in CS Mantech Conference, May 13-16, 2013, New Orleans, Louisiana, USA, pp. 153-156 (Year: 2013).*

Floriot et al. "InGaP Power HBTs : Basic power cells for High Power Transistors", published in AMS Acta—AlmaDL Università di Bologna) (Year: 2020).*

* cited by examiner

*Primary Examiner* — Hafizur Rahman
(74) *Attorney, Agent, or Firm* — McDonald Hopkins LLC

(57) ABSTRACT

A power amplifier circuit includes first and second bias circuits to each apply a bias to first and second amplifiers in first and second modes, respectively. The first bias circuit includes: a first transistor having a collector connected to a power supply electric potential, an emitter connected to the first amplifier, and a base connected to a current source; and a second transistor and a third transistor being diode-connected and connected between the base of the first transistor and a reference electric potential. The second bias circuit includes: a fourth transistor having a collector connected to a power supply electric potential, an emitter connected to the second amplifier, and a base connected to a current source; and a fifth transistor having a base connected to the emitter of the fourth transistor, a collector connected to the base of the fourth transistor, and an emitter connected to a reference electric potential.

8 Claims, 12 Drawing Sheets

POWER AMPLIFIER CIRCUIT

CROSS REFERENCE TO RELATED APPLICATION

This application claims priority from Japanese Patent Application No. 2021-181162 filed on Nov. 5, 2021. The content of this application is incorporated herein by reference in its entirety.

BACKGROUND OF THE DISCLOSURE

1. Field of the Disclosure

The present disclosure relates to a power amplifier circuit.

2. Description of the Related Art

Japanese Unexamined Patent Application Publication No. 2009-165100 below describes a radio frequency amplifier including a bias circuit having a feedback loop.

BRIEF SUMMARY OF THE DISCLOSURE

In a power amplifier circuit mounted on a wireless communication terminal device, an output level is changed in accordance with a distance between a base station and a terminal. This may require the power amplifier circuit to switch over output power. For example, the power amplifier circuit may be required to switch over between an amplification operation at a relatively low first output power (hereinafter referred to as "low power mode" in some cases) and an amplification operation at a relatively high second output power (hereinafter referred to as "high power mode" in some cases).

When the bias circuit described in Japanese Unexamined Patent Application Publication No. 2009-165100 is used to apply a bias to an amplifying transistor in both the low power mode and the high power mode, there is a possibility that gain compression occurs, an adjacent channel leakage power ratio (ACLR) deteriorates, and linearity decreases.

The present disclosure has been made in view of the above, and a possible benefit thereof is to suppress a decrease in linearity.

A power amplifier circuit of an aspect of the present disclosure includes a first amplifier configured to amplify a radio frequency signal in both a first mode and a second mode in which output power is relatively higher than that in the first mode, a second amplifier configured to amplify a radio frequency signal in the second mode, a first bias circuit configured to apply a bias to the first amplifier in both the first mode and the second mode, and a second bias circuit configured to apply a bias to the second amplifier in the second mode. The first bias circuit includes: a first transistor having a collector electrically connected to a power supply electric potential, an emitter electrically connected to the first amplifier, and a base electrically connected to a current source; and a second transistor and a third transistor each of which is diode-connected and which are connected in series between the base of the first transistor and a reference electric potential. The second bias circuit includes: a fourth transistor having a collector electrically connected to a power supply electric potential, an emitter electrically connected to the second amplifier, and a base electrically connected to a current source; and a fifth transistor having a base electrically connected to the emitter of the fourth transistor, a collector electrically connected to the base of the fourth transistor, and an emitter electrically connected to a reference electric potential.

With the use of the present disclosure, it is possible to suppress a decrease in linearity.

DETAILED DESCRIPTION OF THE DISCLOSURE

Hereinafter, an embodiment of a power amplifier circuit of the present disclosure will be described in detail with reference to the drawings. It should be noted that the present disclosure is not limited by the embodiment. Each embodiment is an example, and it is needless to say that the configurations described in different embodiments can partially be replaced or combined.

Embodiment

Circuit Configuration

Figure 1:
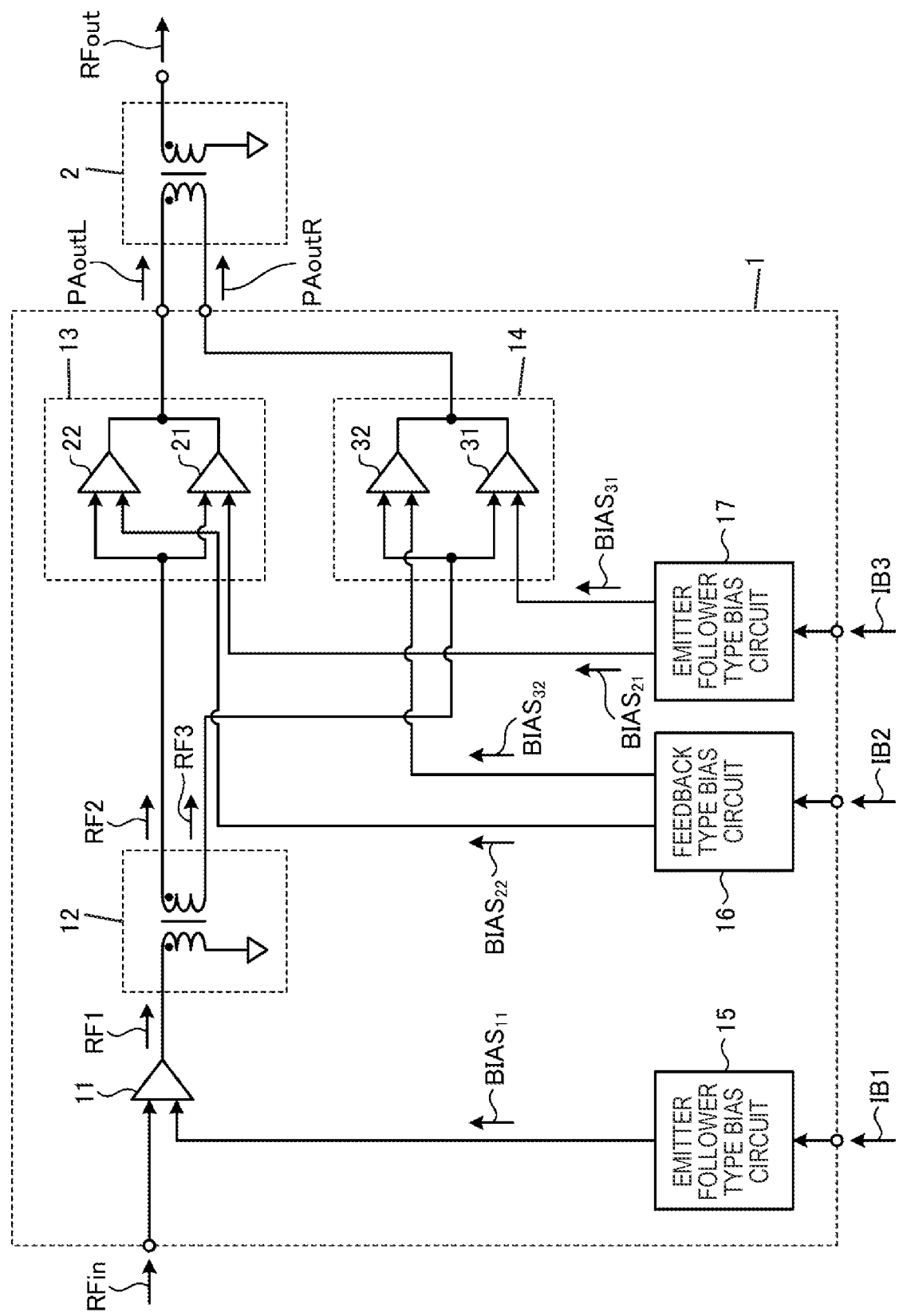
FIG. 1 is a diagram illustrating a configuration of a power amplifier circuit of an embodiment.

FIG. 1 is a diagram illustrating a configuration of a power amplifier circuit of an embodiment. A power amplifier circuit 1 is a differential amplifier circuit configured to amplify a radio frequency signal RFin and output radio frequency signals PAoutL and PAoutR, configuring differential signals, to both ends of a primary winding of a balun 2.

In the embodiment, the power amplifier circuit 1 is a differential amplifier circuit, but the present disclosure is not limited thereto. The power amplifier circuit 1 may be a single-ended amplifier circuit.

One end of the primary winding of the balun 2 is connected to an output of a first power stage amplifier 13 described later, and the other end of the primary winding of the balun 2 is connected to an output of a second power stage amplifier 14 described later. One end of a secondary winding of the balun 2 is electrically connected to a reference electric potential. The reference electric potential is exemplified by a ground electric potential, but the present disclosure is not limited thereto. A radio frequency signal RFout is outputted from the other end of the secondary winding of the balun 2.

The power amplifier circuit 1 performs an amplification operation at a relatively low first output power (hereinafter referred to as "low power mode" in some cases) and an amplification operation at a relatively high second output power (hereinafter referred to as "high power mode" in some cases).

The low power mode corresponds to an example of a "first mode" of the present disclosure. The high power mode corresponds to an example of a "second mode" of the present disclosure.

The power amplifier circuit 1 includes a driver stage amplifier 11, a balun 12, the first power stage amplifier 13, the second power stage amplifier 14, emitter follower type bias circuits 15 and 17, and a feedback type bias circuit 16.

The driver stage amplifier 11 operates in both the low power mode and the high power mode. The driver stage amplifier 11 amplifies the radio frequency signal RFin and outputs a radio frequency signal RF1 to one end of a primary winding of the balun 12.

The driver stage amplifier 11 corresponds to an example of a "third amplifier" of the present disclosure.

Figure 2:
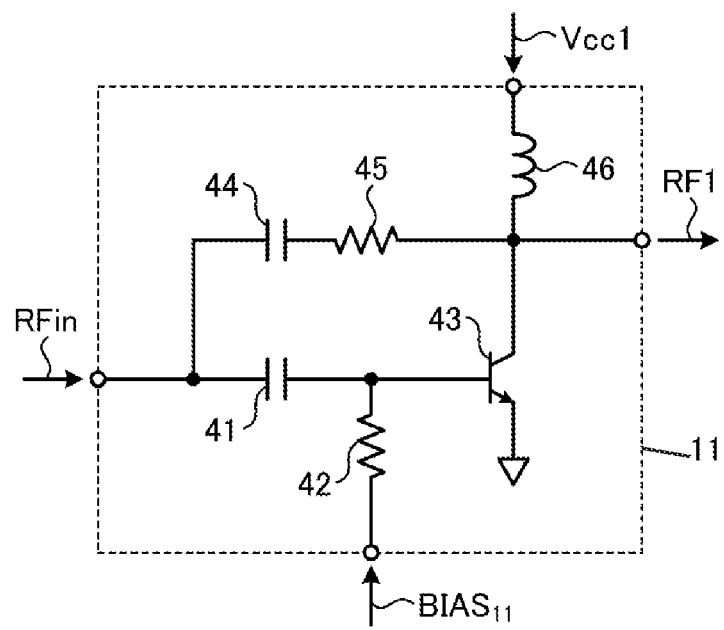
FIG. 2 is a diagram illustrating a configuration of a driver stage amplifier of the power amplifier circuit of the embodiment.

FIG. 2 is a diagram illustrating a configuration of a driver stage amplifier of the power amplifier circuit of the embodiment.

The driver stage amplifier 11 includes capacitors 41 and 44, resistors 42 and 45, a transistor 43, and a choke coil 46.

In the present disclosure, each transistor is a bipolar transistor, but the present disclosure is not limited thereto. The bipolar transistor is exemplified by a heterojunction bipolar transistor (HBT), but the present disclosure is not limited thereto. The transistor may be a field effect transistor (FET), for example. The transistor may be a multi-finger transistor in which multiple unit transistors are electrically connected in parallel. The unit transistor refers to a minimum configuration of a transistor.

The number of fingers of the transistor 43 may be changed in accordance with specifications required for the power amplifier circuit 1.

An emitter of the transistor 43 is electrically connected to the reference electric potential. The radio frequency signal RFin is inputted to a base of the transistor 43 through the capacitor 41. The capacitor 41 is a DC cut capacitor to cut a direct current component of the radio frequency signal RFin.

A bias current $BIAS_{11}$ is inputted from the emitter follower type bias circuit 15 (see FIG. 1) to the base of the transistor 43 through the resistor 42.

A collector of the transistor 43 is electrically connected to a power supply electric potential Vcc1 through the choke coil 46.

The capacitor 44 and the resistor 45 are connected in series between the collector of the transistor 43 and an input terminal of the driver stage amplifier 11, and negative feedback is applied.

The transistor 43 amplifies the radio frequency signal RFin and outputs a radio frequency signal RF1 from the collector to one end of the primary winding of the balun 12 (see FIG. 1). That is, the output (collector) of the transistor 43 and the one end of the primary winding of the balun 12 are connected to each other.

Referring to FIG. 1 again, the other end of the primary winding of the balun 12 is electrically connected to the reference electric potential. Radio frequency signals RF2 and RF3, configuring differential signals, are respectively outputted from both ends of the secondary winding of the balun 12. The differential signals are signals whose phases are substantially opposite to each other. Note that "substantially opposite phases" include not only a case that the phases are different from each other by 180° but also a case that the phases are different from each other by 135° to 225°.

The first power stage amplifier 13 includes a first amplifier 21 and a second amplifier 22. The first amplifier 21 operates in both the low power mode and the high power mode. The second amplifier 22 operates in the high power mode.

The first amplifier 21 corresponds to an example of a "first amplifier" of the present disclosure. The second amplifier 22 corresponds to an example of a "second amplifier" of the present disclosure.

The second power stage amplifier 14 includes a first amplifier 31 and a second amplifier 32. The first amplifier 31 operates in both the low power mode and the high power mode. The second amplifier 32 operates in the high power mode.

The first amplifier 31 corresponds to an example of the "first amplifier" of the present disclosure. The second amplifier 32 corresponds to an example of the "second amplifier" of the present disclosure.

Figure 3:
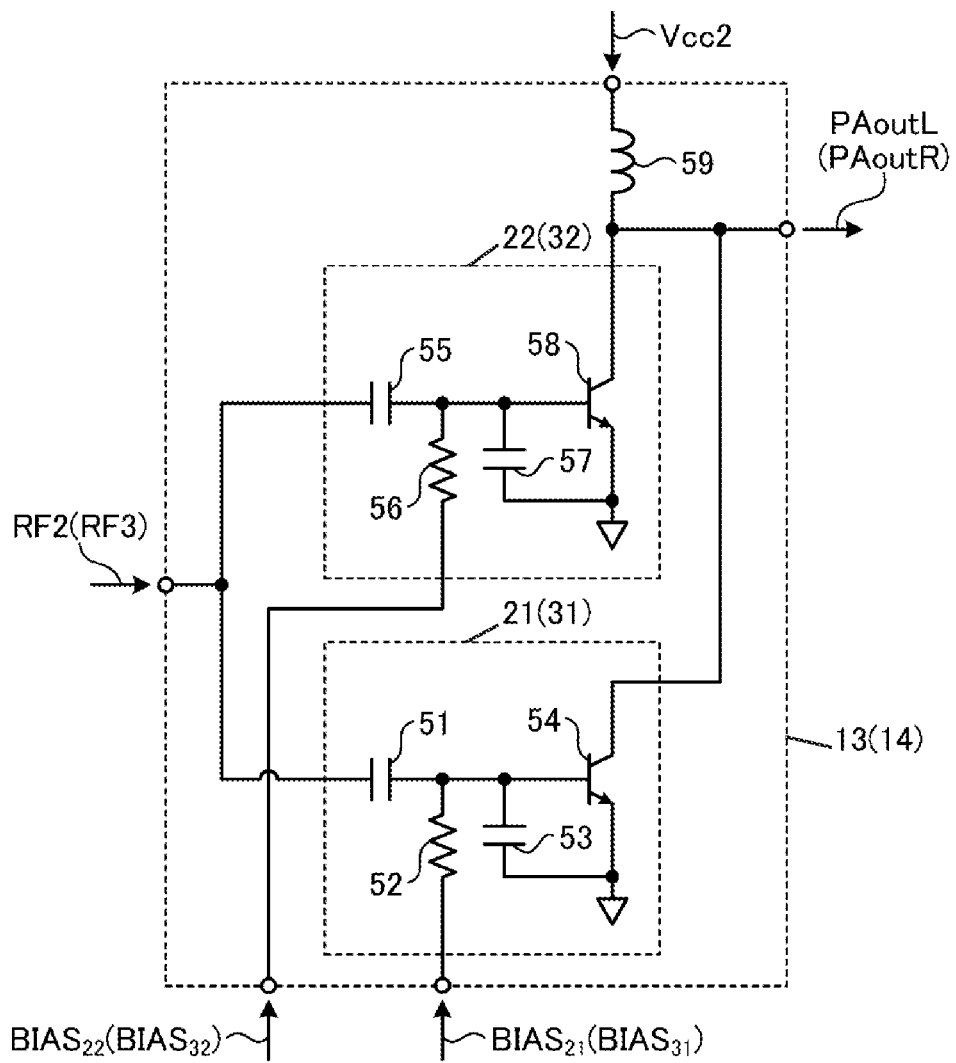
FIG. 3 is a diagram illustrating a configuration of a first power stage amplifier of the power amplifier circuit of the embodiment.

FIG. 3 is a diagram illustrating a configuration of a first power stage amplifier of the power amplifier circuit of the embodiment.

Note that, since the circuit configuration of the second power stage amplifier 14 (see FIG. 1) is similar to the circuit configuration of the first power stage amplifier 13, a description thereof will be omitted.

The first amplifier 21 includes capacitors 51 and 53, a resistor 52, and a transistor 54. The capacitor 51 is provided between a base of the transistor 54 and a node to which the radio frequency signal RF2 is inputted, but may be provided on an opposite side of the transistor 54 relative to the node to which the radio frequency signal RF2 is inputted. Further, the capacitor 53 may be omitted.

An emitter of the transistor 54 is electrically connected to the reference electric potential. The radio frequency signal RF2 is inputted to the base of the transistor 54 through the capacitor 51. The capacitor 51 is a DC cut capacitor to cut a direct current component of the radio frequency signal RF2.

A bias current $BIAS_{21}$ is inputted from the emitter follower type bias circuit 17 (see FIG. 1) to the base of the transistor 54 through the resistor 52.

A collector of the transistor 54 is electrically connected to a power supply electric potential Vcc2 through a choke coil 59.

The capacitor 53 is connected between the base of the transistor 54 and the reference electric potential. The capacitor 53 shunts radio frequency components of the radio frequency signal RF2 to the reference electric potential.

The second amplifier 22 includes capacitors 55 and 57, a resistor 56, and a transistor 58. The capacitor 55 is provided between a base of the transistor 58 and the node to which the radio frequency signal RF2 is inputted, but may be provided on the opposite side of the transistor 58 relative to the node to which the radio frequency signal RF2 is inputted. Further, the capacitor 57 may be omitted.

An emitter of the transistor 58 is electrically connected to the reference electric potential. The radio frequency signal RF2 is inputted to the base of the transistor 58 through the capacitor 55. The capacitor 55 is a DC cut capacitor to cut a direct current component of the radio frequency signal RF2.

A bias current $BIAS_{22}$ is inputted from the feedback type bias circuit 16 (see FIG. 1) to the base of the transistor 58 through the resistor 56.

A collector of the transistor 58 is electrically connected to the power supply electric potential Vcc2 through the choke coil 59.

The capacitor 57 is connected between the base of the transistor 58 and the reference electric potential. The capacitor 57 shunts a radio frequency component of the radio frequency signal RF2 to the reference electric potential.

The transistors 54 and 58 amplify the radio frequency signal RF2 and output the radio frequency signal PAoutL to one end of the primary winding of the balun 2 (see FIG. 1).

The number of fingers of the transistors 54 and 58 may be changed in accordance with specifications required for the power amplifier circuit 1.

For example, the number of fingers of the transistor 54 may be greater than the number of fingers of the transistor 58.

With this, the power amplifier circuit 1 may increase an output power when a relatively large output power is required in the low power mode.

For example, the number of fingers of the transistor 54 may be smaller than the number of fingers of the transistor 58.

With this, the power amplifier circuit 1 may suppress current consumption in addition to a reduction in output power in the low power mode. That is, a power amplifier circuit capable of achieving both the power mode switching and the reduction in current consumption may easily be obtained.

For example, the number of fingers of the transistor 54 may be the same as the number of fingers of the transistor 58.

From a viewpoint of symmetry, the number of fingers of the transistor 54 in the first amplifier 31 of the second power stage amplifier 14 is preferably the same as the number of fingers of the transistor 54 in the first amplifier 21 of the first power stage amplifier 13. The number of fingers of the transistor 58 in the second amplifier 32 of the second power stage amplifier 14 is preferably the same as the number of fingers of the transistor 58 in the second amplifier 22 of the first power stage amplifier 13.

The number of fingers of the transistor 43 (see FIG. 2) in the driver stage amplifier 11 may be the same as or different from the number of fingers of the transistor 54 in the first amplifier 21 of the first power stage amplifier 13. The number of fingers of the transistor 43 in the driver stage amplifier 11 may be the same as or different from the number of fingers of the transistor 58 in the second amplifier 22 of the first power stage amplifier 13. Note that, when the number of fingers of the transistor in the driver stage amplifier is different from the number of fingers of the transistor in the power stage amplifier, impedance may individually be adjusted in the driver stage amplifier and in the power stage amplifier. Accordingly, impedance matching of the power amplifier circuit may more appropriately be performed.

Referring to FIG. 1 again, a bias current IB1 is inputted to the emitter follower type bias circuit 15 from an external current source. Based on the bias current IB1, the emitter follower type bias circuit 15 outputs a bias current $BIAS_{11}$ to the driver stage amplifier 11. The emitter follower type bias circuit 15 outputs the bias current $BIAS_{11}$ in both the low power mode and the high power mode.

The emitter follower type bias circuit 15 corresponds to an example of a "third bias circuit" of the present disclosure.

Figure 4:
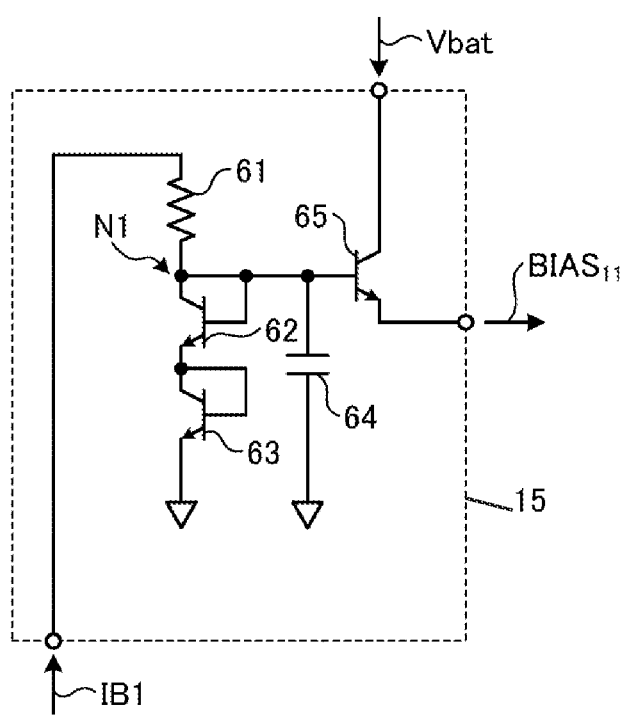
FIG. 4 is a diagram illustrating a configuration of an emitter follower type bias circuit of the power amplifier circuit of the embodiment.

FIG. 4 is a diagram illustrating a configuration of an emitter follower type bias circuit of the power amplifier circuit of the embodiment.

The emitter follower type bias circuit 15 includes a resistor 61, transistors 62, 63, and 65, and a capacitor 64.

The transistor 65 corresponds to an example of a "sixth transistor" of the present disclosure. The transistors 62 and 63 correspond to an example of "seventh transistor and eighth transistor" of the present disclosure.

The bias current IB1 is inputted to one end of the resistor 61. The other end of the resistor 61 is electrically connected to a node N1.

A collector and a base of the transistor 62 are electrically connected to the node N1. That is, the transistor 62 is diode-connected. An emitter of the transistor 62 is electrically connected to a collector and a base of the transistor 63. That is, the transistor 63 is diode-connected. An emitter of the transistor 63 is electrically connected to the reference electric potential.

The transistors 62 and 63 generate a constant voltage. The voltage generated by the transistors 62 and 63 is the voltage at the node N1.

One end of the capacitor 64 is electrically connected to the node N1. The other end of the capacitor 64 is electrically connected to the reference electric potential. The capacitor 64 stabilizes the voltage at the node N1.

A collector of the transistor 65 is electrically connected to a power supply electric potential Vbat. A base of the transistor 65 is electrically connected to the node N1. An emitter of the transistor 65 is electrically connected to one end of the resistor 42 (refer to FIG. 2). The transistor 65 outputs the bias current $BIAS_{11}$ from the emitter thereof to the one end of the resistor 42.

Referring to FIG. 1 again, a bias current IB2 is inputted to the feedback type bias circuit 16 from an external current source. Based on the bias current IB2, the feedback type bias circuit 16 outputs the bias current $BIAS_{22}$ to the second amplifier 22 in the first power stage amplifier 13, and outputs a bias current $BIAS_{32}$ to the second amplifier 32 in the second power stage amplifier 14. The feedback type bias circuit 16 outputs the bias currents $BIAS_{22}$ and $BIAS_{32}$ in the high power mode.

The feedback type bias circuit 16 corresponds to an example of a "second bias circuit" of the present disclosure.

Figure 5:
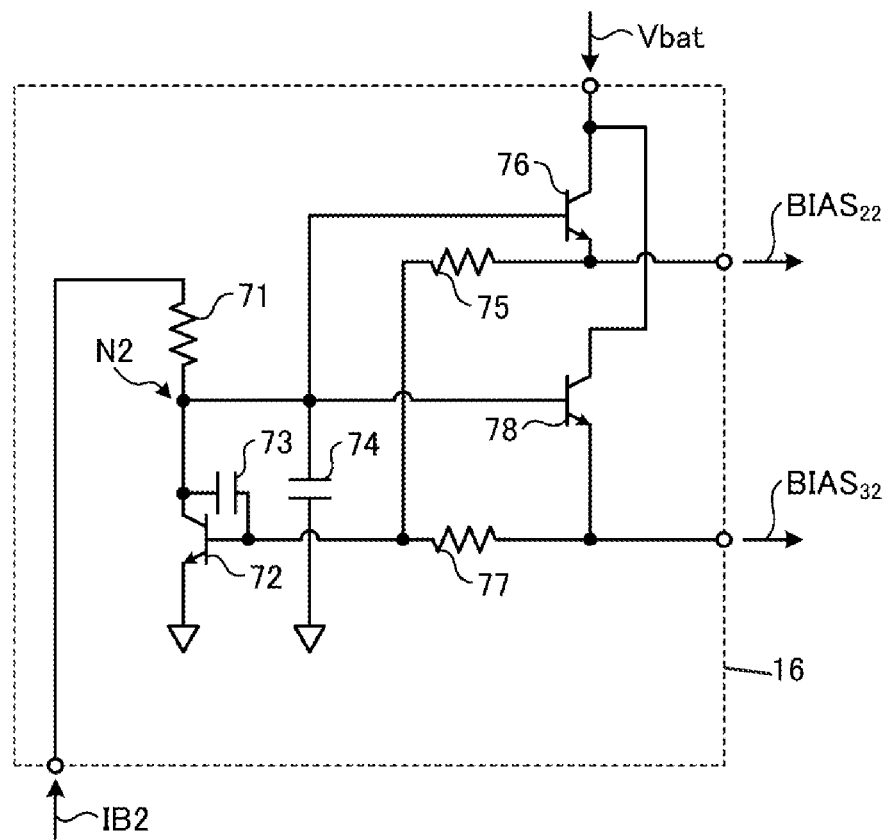
FIG. 5 is a diagram illustrating a configuration of a feedback type bias circuit of the power amplifier circuit of the embodiment.

FIG. 5 is a diagram illustrating a configuration of a feedback type bias circuit of the power amplifier circuit of the embodiment.

The feedback type bias circuit 16 includes resistors 71, 75, and 77, transistors 72, 76, and 78, and capacitors 73 and 74. Note that the resistor 71 and the capacitor 74 are not essential.

Each of the transistors 76 and 78 corresponds to an example of a "fourth transistor" of the present disclosure. The transistor 72 corresponds to an example of a "fifth transistor" of the present disclosure.

The bias current IB2 is inputted to one end of the resistor 71. The other end of the resistor 71 is electrically connected to a node N2.

A collector of the transistor 72 is electrically connected to the node N2. An emitter of the transistor 72 is electrically connected to the reference electric potential. The capacitor 73 is electrically connected between the collector and a base of the transistor 72. The capacitor 73 bypasses a radio frequency signal.

One end of the capacitor 74 is electrically connected to the node N2. The other end of the capacitor 74 is electrically connected to the reference electric potential. The capacitor 74 stabilizes the voltage at the node N2.

A collector of the transistor 76 is electrically connected to the power supply electric potential Vbat. A base of the transistor 76 is electrically connected to the node N2. An emitter of the transistor 76 is electrically connected to one end of the resistor 56 (see FIG. 3) in the second amplifier 22. The resistor 75 is electrically connected between the emitter of the transistor 76 and the base of the transistor 72.

Negative feedback is applied between the emitter and the base of the transistor 76 in a path of: the emitter of the transistor 76→the resistor 75→the base of the transistor 72→the collector of the transistor 72→the node N2→the base of the transistor 76. The transistor 76 outputs the bias current $BIAS_{22}$ from the emitter thereof to the one end of the resistor 56 in the second amplifier 22.

A collector of the transistor 78 is electrically connected to the power supply electric potential Vbat. A base of the transistor 78 is electrically connected to the node N2. An emitter of the transistor 78 is electrically connected to one end of the resistor 56 (see FIG. 3) in the second amplifier 32. The resistor 77 is electrically connected between the emitter of the transistor 78 and the base of the transistor 72.

Negative feedback is applied between the emitter and the base of the transistor 78 in a path of: the emitter of the transistor 78→the resistor 77→the base of the transistor 72→the collector of the transistor 72→the node N2→the base of the transistor 78. The transistor 78 outputs the bias current $BIAS_{32}$ from the emitter thereof to the one end of the resistor 56 in the second amplifier 32.

Referring to FIG. 1 again, a bias current IB3 is inputted to the emitter follower type bias circuit 17 from an external current source. Based on the bias current IB3, the emitter follower type bias circuit 17 outputs the bias current $BIAS_{21}$ to the first amplifier 21 in the first power stage amplifier 13, and outputs a bias current $BIAS_{31}$ to the first amplifier 31 in the second power stage amplifier 14. The emitter follower type bias circuit 17 outputs bias currents $BIAS_{21}$ and $BIAS_{31}$ in both the low power mode and the high power mode.

The emitter follower type bias circuit 17 corresponds to an example of a "first bias circuit" of the present disclosure.

Figure 6:
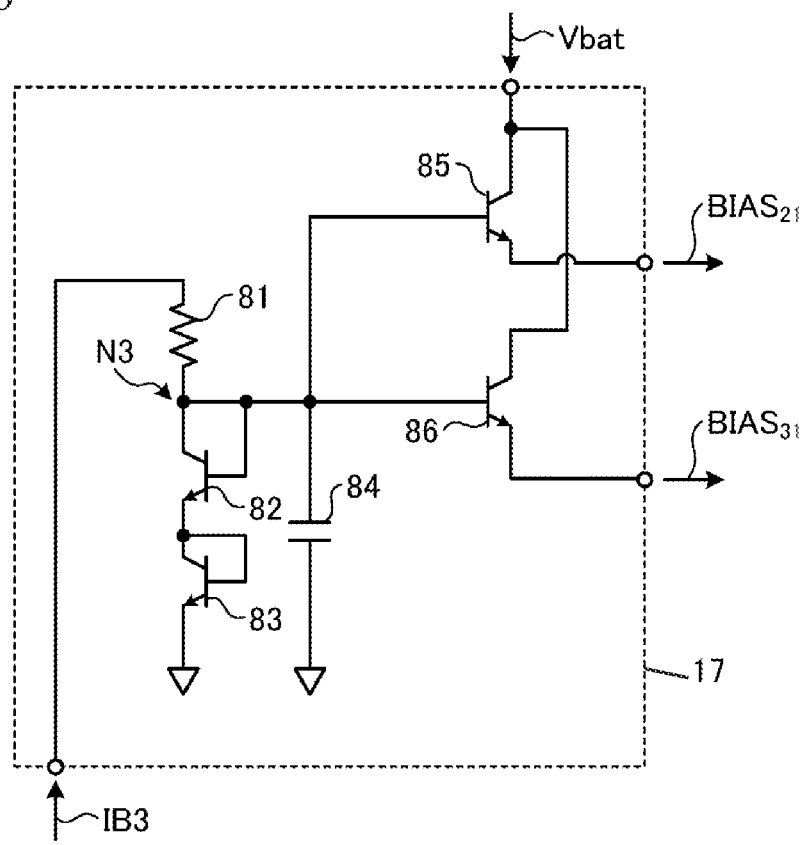
FIG. 6 is a diagram illustrating a configuration of an emitter follower type bias circuit of the power amplifier circuit of the embodiment.

FIG. 6 is a diagram illustrating a configuration of an emitter follower type bias circuit of the power amplifier circuit of the embodiment.

The emitter follower type bias circuit 17 includes a resistor 81, transistors 82, 83, 85 and 86, and a capacitor 84.

Each of the transistors 85 and 86 corresponds to an example of a "first transistor" of the present disclosure. The transistors 82 and 83 correspond to an example of "second transistor and third transistor" of the present disclosure.

The bias current IB3 is inputted to one end of the resistor 81. The other end of the resistor 81 is electrically connected to a node N3.

A collector and a base of the transistor 82 are electrically connected to the node N3. That is, the transistor 82 is diode-connected. An emitter of the transistor 82 is electrically connected to a collector and a base of the transistor 83. That is, the transistor 83 is diode-connected. An emitter of the transistor 83 is electrically connected to the reference electric potential.

The transistors 82 and 83 generate a constant voltage. The voltage generated by the transistors 82 and 83 is the voltage at the node N3.

One end of the capacitor 84 is electrically connected to the node N3. The other end of the capacitor 84 is electrically connected to the reference electric potential. The capacitor 84 stabilizes the voltage at the node N3.

A collector of the transistor 85 is electrically connected to the power supply electric potential Vbat. A base of the transistor 85 is electrically connected to the node N3. An emitter of the transistor 85 is electrically connected to one end of the resistor 52 (see FIG. 3) in the first amplifier 21. That is, the transistor 85 and the resistor 52 in the first amplifier 21 are connected in an emitter follower. The transistor 85 outputs the bias current $BIAS_{21}$ from the emitter thereof to the one end of the resistor 52 in the first amplifier 21.

A collector of the transistor 86 is electrically connected to the power supply electric potential Vbat. A base of transistor 86 is electrically connected to the node N3. An emitter of the transistor 86 is electrically connected to one end of the resistor 52 (see FIG. 3) in the first amplifier 31. That is, the transistor 86 and the resistor 52 in the first amplifier 31 are connected in an emitter follower. The transistor 86 outputs the bias current $BIAS_{31}$ from the emitter thereof to the one end of the resistor 52 in the first amplifier 31.

In the power amplifier circuit 1 of the embodiment, the emitter follower type bias circuit 15 and the emitter follower type bias circuit 17 are different bias circuits.

With this, the power amplifier circuit 1 is capable of individually controlling the driver stage amplifier 11, the first power stage amplifier 13, and the second power stage amplifier 14. Since the amplification factors or the like of the driver stage amplifier and the power stage amplifier are different from each other in many cases, individually controlling as described above enables the amplifiers to operate in appropriate states, respectively, and thus the characteristics may easily be improved.

Comparative Example

Figure 7:
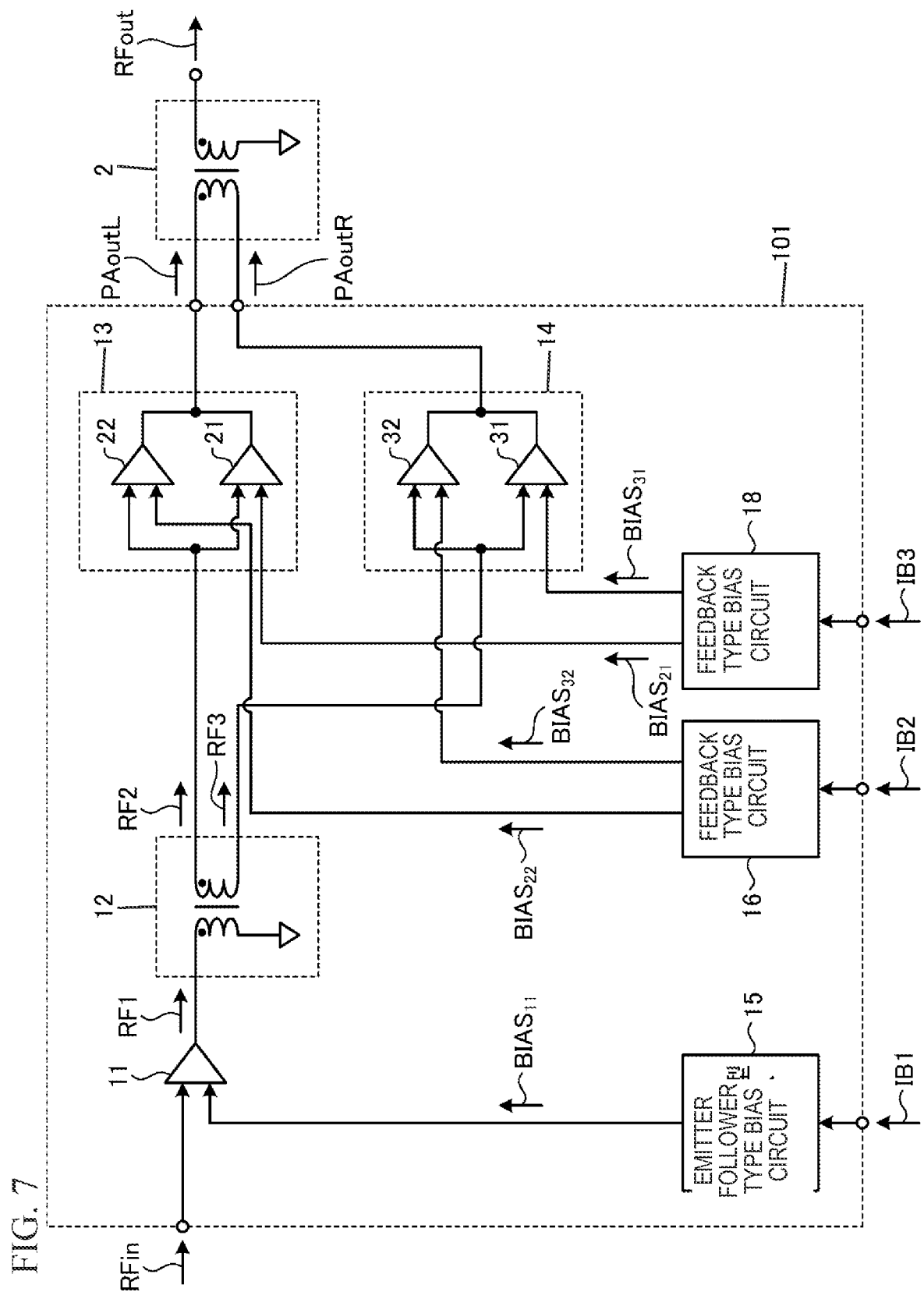
FIG. 7 is a diagram illustrating a configuration of a power amplifier circuit of a comparative example.

FIG. 7 is a diagram illustrating a configuration of a power amplifier circuit of a comparative example.

When compared with the power amplifier circuit 1 (see FIG. 1) of the embodiment, a power amplifier circuit 101 of the comparative example includes a feedback type bias circuit 18 instead of the emitter follower type bias circuit 17.

The feedback type bias circuit 18 outputs the bias currents $BIAS_{21}$ and $BIAS_{31}$ in both the low power mode and the high power mode.

Since the configuration of the feedback type bias circuit 18 is similar to that of the feedback type bias circuit 16, an illustration and a description thereof will be omitted.

Comparison Between Embodiment and Comparative Example

FIG. 8 to FIG. 13 are graphs illustrating characteristics of the power amplifier circuit of the embodiment and the power amplifier circuit of the comparative example.

Figure 8:
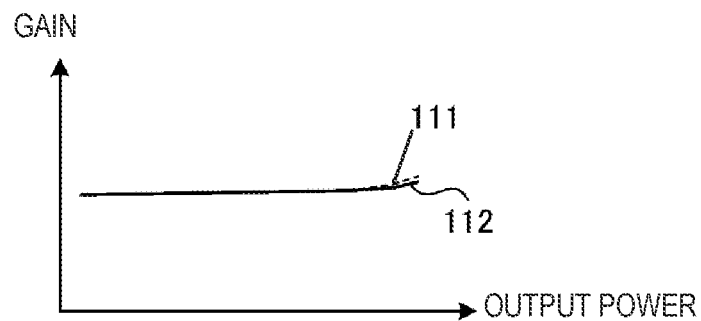
FIG. 8 is a graph illustrating characteristics of the power amplifier circuit of the embodiment and the power amplifier circuit of the comparative example.

FIG. 8 is a graph illustrating a relationship between a gain and an output power of the driver stage amplifier 11 of the power amplifier circuit 1 and the power amplifier circuit 101, in the high power mode. In FIG. 8, the vertical axis represents a gain of the driver stage amplifier 11, and the horizontal axis represents an output power of the driver stage amplifier 11.

A waveform 111 indicates a relationship between a gain and an output power of the driver stage amplifier 11 of the power amplifier circuit 1. A waveform 112 indicates a relationship between a gain and an output power of the driver stage amplifier 11 of the power amplifier circuit 101.

Since both the power amplifier circuit 1 and the power amplifier circuit 101 include the emitter follower type bias circuit 15, power may be increased up to a high output power.

Figure 9:
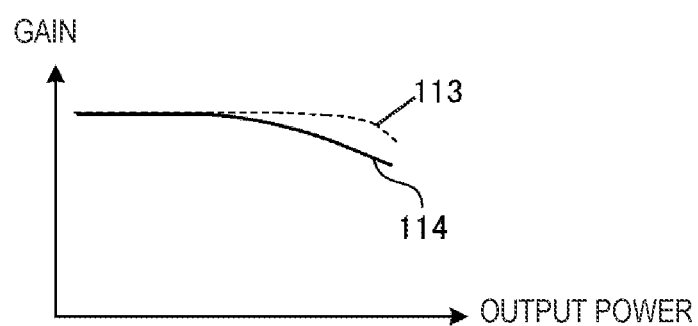
FIG. 9 is a graph illustrating characteristics of the power amplifier circuit of the embodiment and the power amplifier circuit of the comparative example.

FIG. 9 is a graph illustrating a relationship between a gain and an output power of the first power stage amplifier 13 and the second power stage amplifier 14 of the power amplifier circuit 1 and the power amplifier circuit 101, in the high power mode. In FIG. 9, the vertical axis represents a gain of the first power stage amplifier 13 and the second power stage amplifier 14, and the horizontal axis represents an output power of the first power stage amplifier 13 and the second power stage amplifier 14.

A waveform 113 indicates a relationship between a gain and an output power of the first power stage amplifier 13 and the second power stage amplifier 14 of the power amplifier circuit 1. A waveform 114 indicates a relationship between a gain and an output power of the first power stage amplifier 13 and the second power stage amplifier 14 of the power amplifier circuit 101.

In the power amplifier circuit 101, the feedback type bias circuit 18 outputs the bias current $BIAS_{21}$ and the bias current $BIAS_{31}$ to the first amplifier 21 and the first amplifier 31. Because of the characteristics of the feedback type bias circuit 18, in order to maintain linearity, gain compression is applied to the first amplifier 21 and the first amplifier 31 as indicated by the waveform 114. This causes the gain at the time of a high output power to tend to gradually decrease. This leads to deterioration of distortion characteristics in the vicinity of a linear power region.

Whereas, in the power amplifier circuit 1, in order to improve the linearity in the vicinity of the linear power region, the emitter follower type bias circuit 17, capable of increasing power up to a high output power as illustrated in FIG. 8, outputs the bias current $BIAS_{21}$ and the bias current $BIAS_{31}$ to the first amplifier 21 and the first amplifier 31. Accordingly, in the power amplifier circuit 1, as indicated by the waveform 113, the gain compression is weakened and the gain is increased in a case of a high output power, when compared with the waveform 114.

Figure 10:
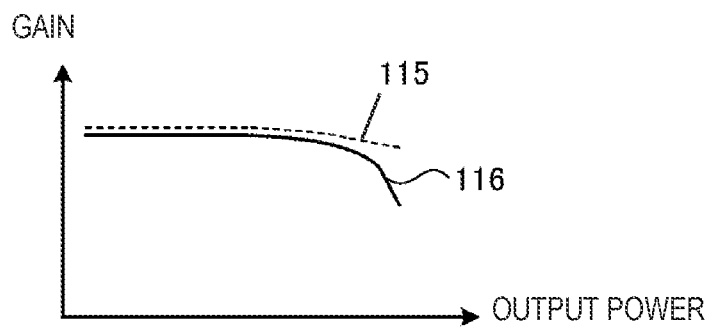
FIG. 10 is a graph illustrating characteristics of the power amplifier circuit of the embodiment and the power amplifier circuit of the comparative example.

FIG. 10 is a graph illustrating a relationship between a gain and an output power of the entire power amplifier circuit 1 and the entire power amplifier circuit 101, in the high power mode. In FIG. 10, the vertical axis represents a gain of the entire power amplifier circuit 1 and the entire power amplifier circuit 101, and the horizontal axis represents an output power of the entire power amplifier circuit 1 and the entire power amplifier circuit 101.

A waveform 115 indicates a relationship between a gain and an output power of the entire power amplifier circuit 1. A waveform 116 indicates a relationship between a gain and an output power of the entire power amplifier circuit 101.

As described above, the gain of the first power stage amplifier 13 and the second power stage amplifier 14 in the power amplifier circuit 1 is higher than that in the power amplifier circuit 101. Accordingly, also in the entire power amplifier circuit 1, as indicated by the waveform 115, the gain is higher in a case of a high output power, when compared with the waveform 116.

Figure 11:
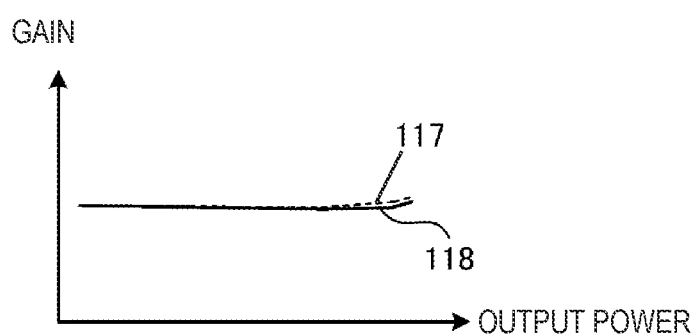
FIG. 11 is a graph illustrating characteristics of the power amplifier circuit of the embodiment and the power amplifier circuit of the comparative example.

FIG. 11 is a graph illustrating a relationship between a gain and an output power of the driver stage amplifier 11 of the power amplifier circuit 1 and the power amplifier circuit 101, in the low power mode. In FIG. 11, the vertical axis represents a gain of the driver stage amplifier 11, and the horizontal axis represents an output power of the driver stage amplifier 11.

A waveform 117 indicates a relationship between a gain and an output power of the driver stage amplifier 11 of the power amplifier circuit 1. A waveform 118 indicates a relationship between a gain and an output power of the driver stage amplifier 11 of the power amplifier circuit 101.

Since both the power amplifier circuit 1 and the power amplifier circuit 101 include the emitter follower type bias circuit 15, power may be increased up to a high output power.

Figure 12:
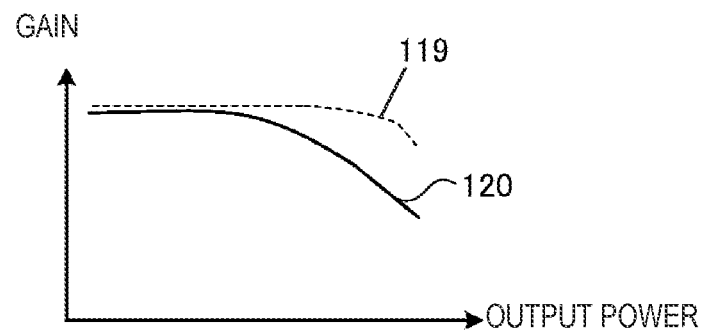
FIG. 12 is a graph illustrating characteristics of the power amplifier circuit of the embodiment and the power amplifier circuit of the comparative example.

FIG. 12 is a graph illustrating a relationship between a gain and an output power of the first power stage amplifier 13 and the second power stage amplifier 14 of the power amplifier circuit 1 and the power amplifier circuit 101, in the low power mode. In FIG. 12, the vertical axis represents a gain of the first power stage amplifier 13 and the second power stage amplifier 14, and the horizontal axis represents an output power of the first power stage amplifier 13 and the second power stage amplifier 14.

A waveform 119 indicates a relationship between a gain and an output power of the first power stage amplifier 13 and the second power stage amplifier 14 of the power amplifier circuit 1. A waveform 120 indicates a relationship between a gain and an output power of the first power stage amplifier 13 and the second power stage amplifier 14 of the power amplifier circuit 101.

In the power amplifier circuit 101, the feedback type bias circuit 18 outputs the bias current $BIAS_{21}$ and the bias current $BIAS_{31}$ to the first amplifier 21 and the first amplifier 31. Because of the characteristics of the feedback type bias circuit 18, in order to maintain linearity, the gain compression is applied to the first amplifier 21 and the first amplifier 31. This causes the gain at the time of a high output power to tend to gradually decrease. This leads to deterioration of the distortion characteristics in the vicinity of the linear power region.

Whereas, in the power amplifier circuit 1, in order to improve the linearity in the vicinity of the linear power region, the emitter follower type bias circuit 17 outputs the bias current $BIAS_{21}$ and the bias current $BIAS_{31}$ to the first amplifier 21 and the first amplifier 31. Accordingly, in the power amplifier circuit 1, as indicated by the waveform 119, the gain compression is weakened and the gain is increased in a case of a high output power, when compared with the waveform 120.

Figure 13:
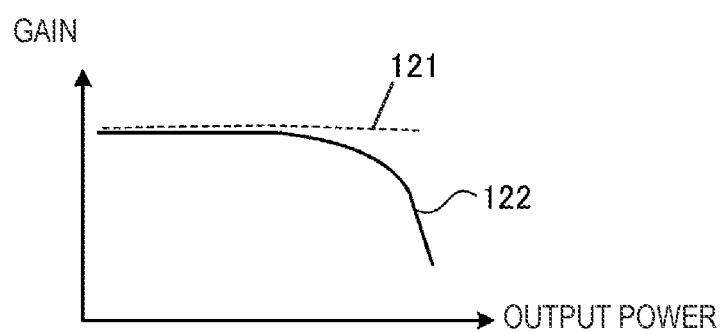
FIG. 13 is a graph illustrating characteristics of the power amplifier circuit of the embodiment and the power amplifier circuit of the comparative example.

FIG. 13 is a graph illustrating a relationship between a gain and an output power of the entire power amplifier circuit 1 and the entire power amplifier circuit 101, in the low power mode. In FIG. 13, the vertical axis represents a gain of the entire power amplifier circuit 1 and the entire power amplifier circuit 101, and the horizontal axis represents an output power of the entire power amplifier circuit 1 and the entire power amplifier circuit 101.

A waveform 121 indicates a relationship between a gain and an output power of the entire power amplifier circuit 1. A waveform 122 indicates a relationship between a gain and an output power of the entire power amplifier circuit 101.

As described above, the gain of the first power stage amplifier 13 and the second power stage amplifier 14 in the power amplifier circuit 1 is higher than that in the power amplifier circuit 101. Accordingly, also in the entire power amplifier circuit 1, as indicated by the waveform 121, the gain is higher in a case of a high output power, when compared with the waveform 122.

FIG. 14 to FIG. 17 are graphs illustrating circuit simulation results of the power amplifier circuit of the embodiment and the power amplifier circuit of the comparative example.

Figure 14:
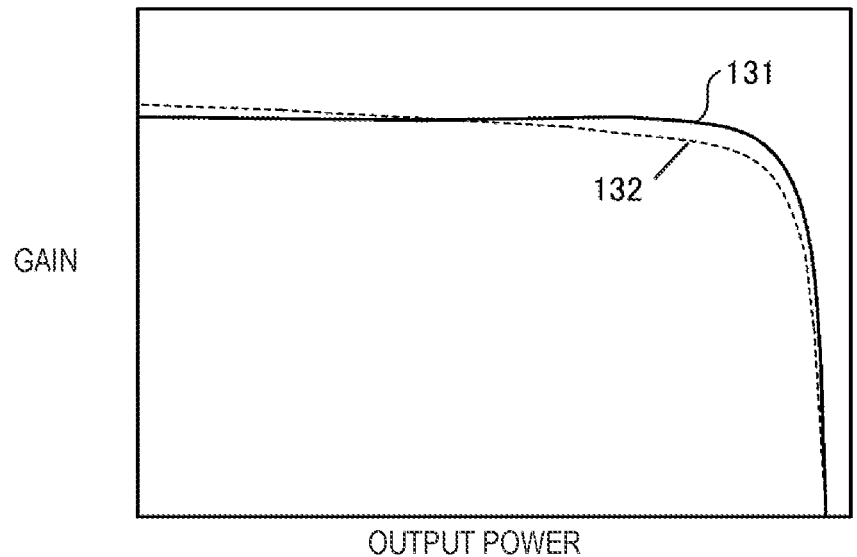
FIG. 14 is a graph illustrating a circuit simulation result of the power amplifier circuit of the embodiment and the power amplifier circuit of the comparative example.

FIG. 14 is a graph illustrating a circuit simulation result of a relationship between a gain and an output power of the entire power amplifier circuit 1 and the entire power amplifier circuit 101. In FIG. 14, the vertical axis represents a gain of the entire power amplifier circuit 1 and the entire power amplifier circuit 101, and the horizontal axis represents an output power of the entire power amplifier circuit 1 and the entire power amplifier circuit 101.

A waveform 131 indicates a relationship between a gain and an output power of the entire power amplifier circuit 1. A waveform 132 indicates a relationship between a gain and an output power of the entire power amplifier circuit 101.

In the power amplifier circuit 1, as indicated by the waveform 131, the gain is higher in a case of a high output power, when compared with the waveform 132.

Figure 15:
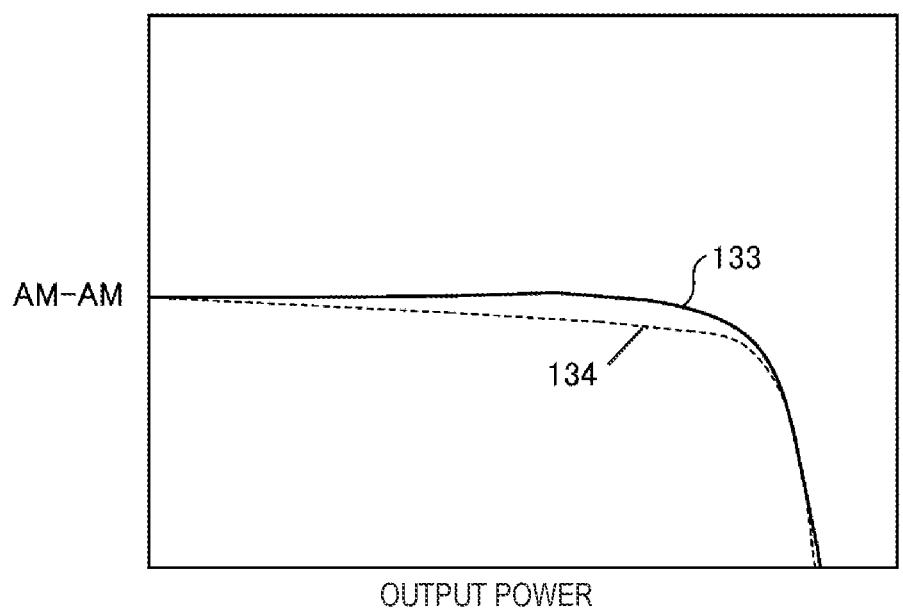
FIG. 15 is a graph illustrating a circuit simulation result of the power amplifier circuit of the embodiment and the power amplifier circuit of the comparative example.

FIG. 15 is a graph illustrating a circuit simulation result of a relationship between AM-AM and an output power of the entire power amplifier circuit 1 and the entire power amplifier circuit 101. In FIG. 15, the vertical axis represents AM-AM of the entire power amplifier circuit 1 and the entire power amplifier circuit 101, and the horizontal axis represents an output power of the entire power amplifier circuit 1 and the entire power amplifier circuit 101.

A waveform 133 indicates a relationship between AM-AM and an output power of the entire power amplifier circuit 1. A waveform 134 indicates a relationship between AM-AM and an output power of the entire power amplifier circuit 101.

In the power amplifier circuit 1, as indicated by the waveform 133, AM-AM is higher in a case of a high output power, when compared with the waveform 134. That is, the distortion characteristics of the power amplifier circuit 1 are improved when compared with those of the power amplifier circuit 101.

Figure 16:
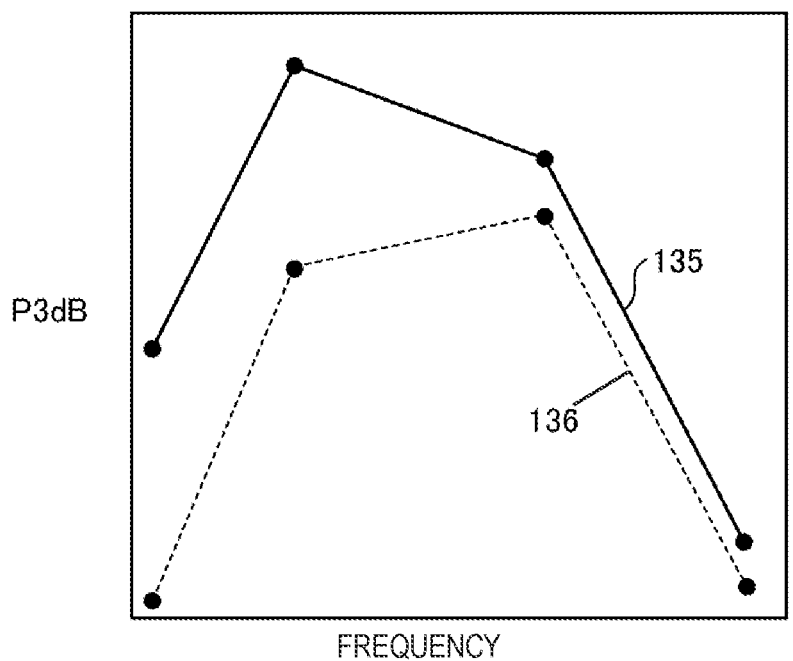
FIG. 16 is a graph illustrating a circuit simulation result of the power amplifier circuit of the embodiment and the power amplifier circuit of the comparative example.

FIG. 16 is a graph illustrating a circuit simulation result of a relationship between P3 dB and a frequency of a radio frequency signal of the entire power amplifier circuit 1 and the entire power amplifier circuit 101. In FIG. 16, the vertical axis represents P3 dB (magnitude of output power of 3 dB gain decrease from the maximum gain value) of the entire power amplifier circuit 1 and the entire power amplifier circuit 101, and the horizontal axis represents a frequency of a radio frequency signal.

A waveform 135 indicates a relationship between P3 dB of the entire power amplifier circuit 1 and a frequency of a radio frequency signal. A waveform 136 indicates a relationship between P3 dB of the entire power amplifier circuit 101 and a frequency of a radio frequency signal.

In the power amplifier circuit 1, as indicated by the waveform 135, P3 dB is higher as a result of the improvement in AM-AM described above, when compared with the waveform 136. Accordingly, the linearity of the power amplifier circuit 1 is improved.

Figure 17:
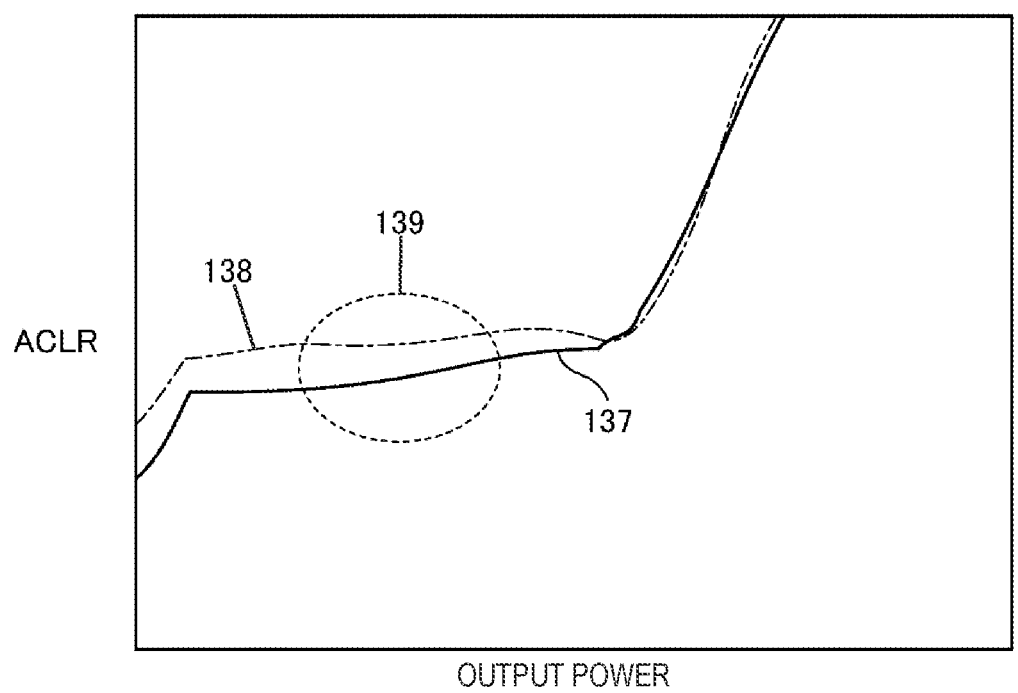
FIG. 17 is a graph illustrating a circuit simulation result of the power amplifier circuit of the embodiment and the power amplifier circuit of the comparative example.

FIG. 17 is a graph illustrating a circuit simulation result of a relationship between ACLR and an output power of the entire power amplifier circuit 1 and the entire power amplifier circuit 101. In FIG. 17, the vertical axis represents ACLR of the entire power amplifier circuit 1 and the entire power amplifier circuit 101, and the horizontal axis represents an output power.

A waveform 137 indicates a relationship between ACLR and an output power of the entire power amplifier circuit 1. A waveform 138 indicates a relationship between ACLR and an output power of the entire power amplifier circuit 101.

In the power amplifier circuit 1, as indicated by the waveform 137, ACLR is improved in a region 139, for example, when compared with the waveform 138.

Overview (1) In the power amplifier circuit 101 of the comparative example, only the feedback type bias circuits 16 and 18 apply biases to the first amplifiers 21 and 31, and the second amplifiers 22 and 32. In the case above, in the high power mode, the gain compression occurs in order to maintain linearity, the gain at the time of a high power decreases, and ACLR deteriorates. Further, also in the low power mode, the gain compression occurs and ACLR deteriorates.

Further, a case will be examined in which the feedback type bias circuit 16 is replaced with an emitter follower type bias circuit in the power amplifier circuit 1 (see FIG. 1). That is, a case will be examined in which only the emitter follower type bias circuits apply biases to the first amplifiers 21 and 31, and the second amplifiers 22 and 32. In the case above, preferable linearity is obtained in the low power mode. However, in the high power mode, the gain expansion occurs and ACLR deteriorates.

Then, in the power amplifier circuit 1, in the low power mode, the emitter follower type bias circuit 17 applies biases to the first amplifiers 21 and 31, and the second amplifiers 22 and 32. Further, in the high power mode, the feedback type bias circuit 16 and the emitter follower type bias circuit 17 apply biases to the first amplifiers 21 and 31, and the second amplifiers 22 and 32.

That is, in the low power mode, the power amplifier circuit 1 uses the emitter follower type bias circuit 17 in which the gain compression is less likely to occur. Further, in the high power mode, the power amplifier circuit 1 also uses the feedback type bias circuit 16 in which the gain compression is likely to occur, in addition to the emitter follower type bias circuit 17 in which the gain expansion is likely to occur. With this, the power amplifier circuit 1 combines the advantages of both the feedback type bias circuit 16 and the emitter follower type bias circuit 17, and may achieve high linearity from a low power region to a high power region.

(2) The number of fingers of the transistor 54 in the first amplifiers 21 and 31 may be larger than the number of fingers of the transistor 58 in the second amplifiers 22 and 32.

With this, the power amplifier circuit 1 may increase an output power in the low power mode.

(3) The number of fingers of the transistor 54 in the first amplifiers 21 and 31 may be smaller than the number of fingers of the transistor 58 in the second amplifiers 22 and 32.

With this, the power amplifier circuit 1 may suppress current consumption in the low power mode.

(4) The feedback type bias circuit 16 has a feature that the gain compression is likely to occur, and the emitter follower type bias circuit 17 has a feature that the gain expansion is likely to occur. These features may be used to determine the allocation of the number of fingers of the transistor 54 and the transistor 58.

(5) The power amplifier circuit 1 preferably has a multi-stage configuration including the driver stage amplifier 11, the first power stage amplifier 13, and the second power stage amplifier 14.

With this, the linearity of the power amplifier circuit 1 is less likely to decrease.

(6) The emitter follower type bias circuit 15 and the emitter follower type bias circuit 17 are preferably different bias circuits.

With this, the power amplifier circuit 1 is capable of individually controlling the driver stage amplifier 11, the first power stage amplifier 13, and the second power stage amplifier 14.

It should be noted that the embodiment described above is intended to facilitate the understanding of the present disclosure and is not intended to limit interpretation of the present disclosure. The present disclosure can be changed and/or improved without departing from the gist thereof, and the present disclosure includes equivalents thereof.

What is claimed is:

1. A power amplifier circuit, comprising:
    a first amplifier configured to amplify a radio frequency signal in both a first mode and a second mode, an output power of the power amplifier circuit being greater in the second mode than in the first mode;
    a second amplifier configured to amplify the radio frequency signal in the second mode;
    a first bias circuit configured to apply a first bias to the first amplifier in both the first mode and the second mode; and
    a second bias circuit configured to apply a second bias to the second amplifier in the second mode,
    wherein the first bias circuit comprise:
        a first transistor having a collector electrically connected to a power supply electric potential, an emitter electrically connected to the first amplifier, and a base electrically connected to a first current source, and
        a second transistor and a third transistor, each of the second transistor and the third transistor being diode-connected and connected in series between the base of the first transistor and a reference electric potential, and
    the second bias circuit comprise:
        a fourth transistor having a collector electrically connected to the power supply electric potential, an emitter electrically connected to the second amplifier, and a base electrically connected to a second current source, and
        a fifth transistor having a base electrically connected to the emitter of the fourth transistor, a collector electrically connected to the base of the fourth transistor, and an emitter electrically connected to the reference electric potential.

2. The power amplifier circuit according to claim 1, wherein each of the first amplifier and the second amplifier comprises a multi-finger transistor configured to amplify the radio frequency signal, and
    a number of fingers of the multi-finger transistor in the first amplifier is greater than a number of fingers of the multi-finger transistor in the second amplifier.

3. The power amplifier circuit according to claim 1, wherein each of the first amplifier and the second amplifier comprises a multi-finger transistor configured to amplify the radio frequency signal, and
    a number of fingers of the multi-finger transistor in the first amplifier is smaller than a number of fingers of the multi-finger transistor in the second amplifier.

4. The power amplifier circuit according to claim 1, further comprising:
    a third amplifier in a stage preceding the first amplifier and the second amplifier, the third amplifier being configured to amplify the radio frequency signal in both the first mode and the second mode; and
    a third bias circuit configured to apply a third bias to the third amplifier in both the first mode and the second mode,
    wherein the third bias circuit comprises:
        a sixth transistor having a collector electrically connected to the power supply electric potential, an emitter electrically connected to the third amplifier, and a base electrically connected to a third current source, and
        a seventh transistor and an eighth transistor, each of the seventh transistor and the eighth transistor being diode-connected and connected in series between the base of the sixth transistor and the reference electric potential.

5. The power amplifier circuit according to claim 2, further comprising:
    a third amplifier in a stage preceding the first amplifier and the second amplifier, the third amplifier being configured to amplify the radio frequency signal in both the first mode and the second mode; and
    a third bias circuit configured to apply a third bias to the third amplifier in both the first mode and the second mode,
    wherein the third bias circuit comprises:
        a sixth transistor having a collector electrically connected to the power supply electric potential, an emitter electrically connected to the third amplifier, and a base electrically connected to a third current source, and
        a seventh transistor and an eighth transistor, each of the seventh transistor and the eighth transistor being diode-connected and connected in series between the base of the sixth transistor and the reference electric potential.

6. The power amplifier circuit according to claim 3, further comprising:
    a third amplifier in a stage preceding the first amplifier and the second amplifier, the third amplifier being configured to amplify the radio frequency signal in both the first mode and the second mode; and a third bias circuit configured to apply a third bias to the third amplifier in both the first mode and the second mode, wherein the third bias circuit comprises:
- a sixth transistor having a collector electrically connected to the power supply electric potential, an emitter electrically connected to the third amplifier, and a base electrically connected to a third current source, and
- a seventh transistor and an eighth transistor, each of the seventh transistor and the eighth transistor being diode-connected and connected in series between the base of the sixth transistor and the reference electric potential.

7. The power amplifier circuit according to claim 4, wherein the first bias circuit and the third bias circuit are different bias circuits.

8. The power amplifier circuit according to claim 4, wherein the third amplifier comprises a multi-finger transistor configured to amplify the radio frequency signal, and wherein a number of fingers of the multi-finger transistor in the third amplifier is different than a number of fingers of the multi-finger transistor in the first amplifier and is different than a number of fingers of the multi-finger transistor in the second amplifier.

* * * * *